United States Patent [19]
Miki et al.

[11] Patent Number: 6,064,607
[45] Date of Patent: *May 16, 2000

[54] SEMICONDUCTOR MEMORY DEVICE WITH PREDECODER

[75] Inventors: Takeo Miki; Mikio Asakura; Satoshi Kawasaki, all of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/177,484

[22] Filed: Oct. 23, 1998

[51] Int. Cl.⁷ ....................................... G11C 7/00
[52] U.S. Cl. ................ 365/200; 365/230.06; 365/230.01
[58] Field of Search ................................ 365/200, 225.7, 365/230.06, 230.08, 230.01

[56] References Cited

U.S. PATENT DOCUMENTS

| | | | |
|---|---|---|---|
| 5,469,391 | 11/1995 | Haraguchi | 365/200 |
| 5,519,657 | 5/1996 | Arimoto | 365/200 |
| 5,689,465 | 11/1997 | Sukegawa et al. | 365/200 |
| 5,835,424 | 11/1998 | Kikukawa et al. | 365/200 |

*Primary Examiner*—David Nelms
*Assistant Examiner*—Thong Le
*Attorney, Agent, or Firm*—McDermott, Will & Emery

[57] ABSTRACT

Each of first and second program circuits includes a determination node, first to fourth fuses, first to fourth N channel MOS transistors, and first to fourth supply lines. The first to fourth N channel MOS transistors receive first to fourth row address predecode signals, respectively. The first N channel MOS transistor included in the first program circuit and the first N channel MOS transistor included in the second program circuit are arranged adjacent to each other. The first supply line provides a first row address predecode signal to the gate of these two N channel MOS transistors. The same applies for the second to fourth N channel MOS transistors and the second to fourth supply lines. Accordingly, the interconnection capacitance of the row address predecode signal line can be reduced. Also, the size of the transistor driving the row address predecode signal and the transistors in the program circuit can be reduced to allow a smaller layout area for the entire chip.

11 Claims, 11 Drawing Sheets

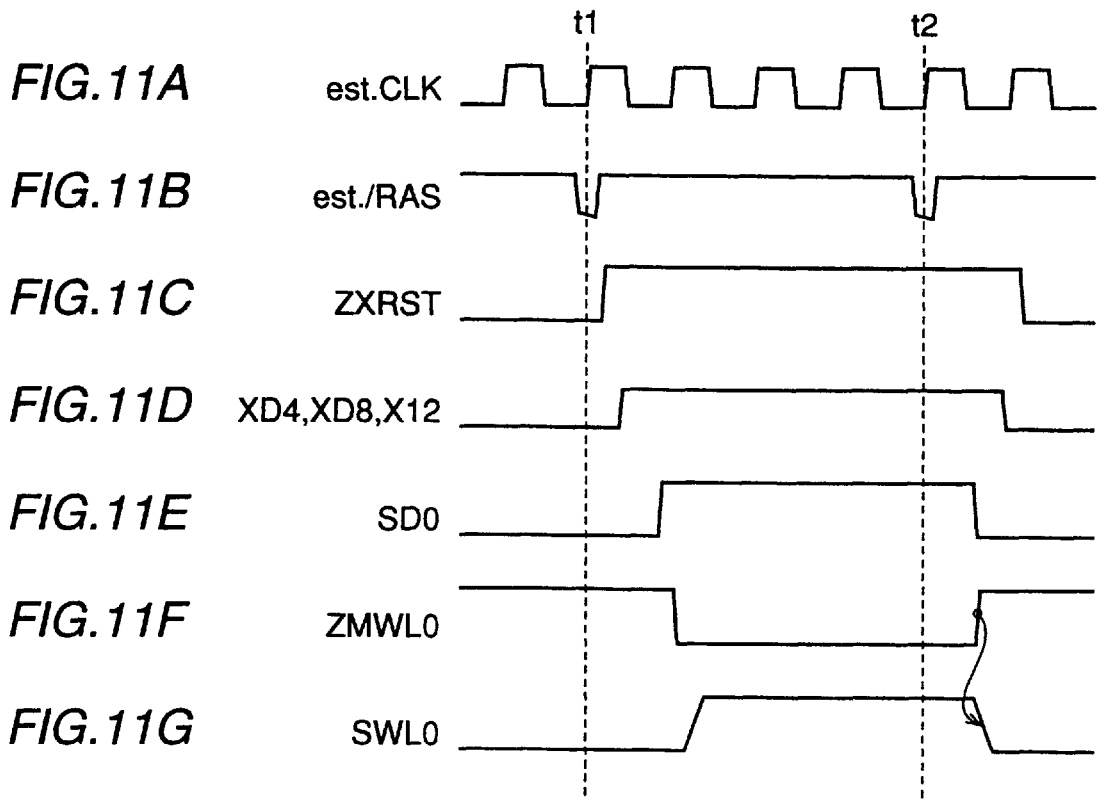
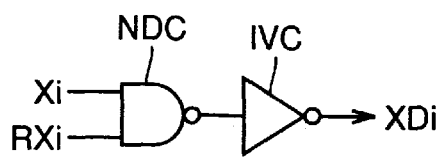

SEMICONDUCTOR MEMORY DEVICE WITH PREDECODER

BACKGROUND OF THE INVENTION

1. Field of the Invention

The present invention relates to semiconductor memory devices, and more particularly, to a semiconductor memory device having a predecoder that decodes an internal address signal to generate an address predecode signal.

2. Description of the Background Art

[Related Art 1]

In a semiconductor memory device such as a DRAM (Dynamic Random Access Memory), spare rows and columns are provided beforehand in a memory cell array to repair a defect by replacing a defective memory cell that does not operate properly with a spare memory cell in the unit of a row or column. Defective address information must be programmed at the program circuit in the DRAM in order to switch the address to that of a spare memory cell when an address corresponding to the memory cell that does not operate properly (referred to as "defective address" hereinafter) is input in this system. Such a program circuit is generally provided corresponding to each defective address. The method of blowing out a fuse with a laser beam is widely used in the recent memories of a large capacity as the method of programming a defective address.

FIG. 14 is a layout of an example structure of such a program circuit. Referring to FIG. 14, a program circuit P11 is provided corresponding to a defective address FA11, and a program circuit P12 is provided corresponding to a defective address FA12.

Program circuit P11 includes a determination node JN, fuses F10–F13, and N channel MOS transistors QN10–QN13. N channel MOS transistors QN10–QN13 are aligned adjacent to each other. N channel MOS transistors QN10–QN13 have each gate gt connected to corresponding address predecode signal lines X0–X3 by corresponding supply lines DL10–DL13, respectively.

Program circuit P12 includes a determination node JN2, fuses F20–F23, and N channel MOS transistors QN20–QN23 aligned adjacent to each other. N channel MOS transistors QN20–QN23 have each gate gt connected to corresponding address predecode signal lines X0–X3 by corresponding supply lines DL20–DL23, respectively.

In general, the respective program circuits corresponding to a defective address (here, program circuits P11 and P12) are arranged in a centralized manner. More specifically, N channel MOS transistors QN10–QN13 are arranged in a row adjacent to each other in program circuit P11, and N channel MOS transistors QN20–QN23 are arranged in a row adjacent to each other in program circuit P12. Furthermore, N channel MOS transistors QN10–QN13 and QN20–QN23 are arranged in one row as a whole.

The operation of program circuits P11 and P12 will be described hereinafter. The fuse corresponding to the signal at an H level (logical high) of each of bit signals X0–X3 of the address predecode signal corresponding to the defective address is blown out with a laser beam in advance. Here, it is assumed that address predecode signals X0–X3 corresponding to defective address FA11 is (X0, X1, X2. X3)= (1000), and address predecode signals X0–X3 corresponding to defective address FA12 is (X0, X1, X2. X3)=(0001). In this case, fuses F10 and F23 are blown out. Determination nodes JN1 and JN2 are precharged to the power supply voltage.

Under this state, address predecode signals X0–X3 are applied to gates gt of N channel MOS transistor QN10–QN13 and QN20–QN23.

When input address predecode signals X0–X3 do not match any of the preprogrammed defective addresses FA11 and FA12, determination nodes JN1 and JN2 are discharged to the level of ground voltage Vss since at least one of N channel MOS transistors QN11–QN13 and QN20–QN22 corresponding to any of fuses F11–F13 and F20–F22 out of fuses F10–F13 and F20–F23 in program circuits P11 and P12 that are not blowed out is turned on. Therefore, redundancy activation signals FUSE1 and FUSE2 of an L level (logical low) are supplied to corresponding spare row decoders to render the spare row decoders inactive.

Next, the case where input address predecode signals X0–X3 match preprogrammed defective address FA11 will be described hereinafter.

In this case, only N channel MOS transistor QN10 corresponding to fuse F10 that is blowed out is turned on in program circuit P11. Therefore, the voltage at determination node JN1 is maintained at the level of the power supply voltage. Redundancy activation signal FUSE1 of an H level is supplied to the corresponding spare row decoder to render the same active. As a result, the defective portion in the memory cell array corresponding to defective address FA11 is repaired.

In program circuit P12, N channel MOS transistor QN20 corresponding to fuse F20 that is not blowed out is turned on, whereby determination node JN2 is discharged to the level of the ground voltage Vss. As a result, redundancy activation signal FUSE2 of an L level is supplied to the corresponding spare row decoder to render the same inactive.

The defective portion of the memory cell array corresponding to defective address FA12 is replaced in a similar manner when input address predecode signals X0–X3 match defective address FA12.

Thus, determination is made whether input address predecode signals X0–X3 match preprogrammed defective addresses FA11 and FA12 to supply redundancy activation signals FUSE1 and FUSE2 of an H level in response to a matching result to render the redundancy circuit active.

[Related Art 2]

In a semiconductor memory device such as a DRAM (Dynamic Random Access Memory), a predecoder circuit is provided generating an address predecode signal by decoding by every 2 bits or 3 bits an internal address signal generated at an address buffer before being applied to the decoder circuit. The predecoder circuit is provided from the standpoint of reducing the number of transistors forming the decoder circuit, reducing the pitch of pattern layout of the decoder circuit, and increasing the operation speed.

An address predecode signal is applied to the gate of many transistors included in the row decoder circuit and the program circuit . In many cases, the address predecode signal line extends over a long length on the chip. Therefore, the load of the address predecode signal line becomes greater. However, an address predecode signal has a low drivability. Therefore, the delay time of an address predecode signal will become greater.

In view of the foregoing, a repeater circuit is inserted for all the address predecode signal lines from the predecoder. The repeater circuit is formed mainly of an even number of stages of inverter circuits to improve the drivability of the next stage of transistor.

[Problem in Related Art 1]

In accordance with the higher complexity of memory cells, the bit width of the address signal and the address predecode signal is increased. This means that the number of N channel MOS transistors and fuses provided corresponding to the bit signal of the address predecode signal in each program circuit becomes greater.

Also, the number of spare rows and columns provided in the memory cell array is increased. Therefore, the number of program circuits is increased.

Thus, the load on the address predecode signal line becomes greater.

[Problem in Related Art 2]

When the length of an address predecode signal line is great, the insertion of a repeater circuit allows the drivability of the transistor included in the next stage of row decoder circuit and program circuit to be increased to speed the operation.

However, when the length of the address predecode signal line is short or when the load of the address predecode signal line is small, the load of the repeater circuit itself will increase the load of the address predecode signal line to delay the propagation of an address predecode signal.

SUMMARY OF THE INVENTION

An object of the present invention is to provide a semiconductor memory device that can reduce the load on an address predecode signal line.

According to an aspect of the present invention, a semiconductor memory device includes a decoder, a plurality of address predecode signal lines, and a plurality of program circuits. The decoder responds to an address signal to generate an address predecode signal of a plurality of bits. The plurality of address predecode signal lines are provided corresponding to the plurality of bits of the address predecode signals. Each address predecode signal line transmits a corresponding bit signal of the address predecode signal. The plurality of program circuits correspond to a plurality of redundancy circuits. Each program circuit is programmable of a defective address to render a corresponding redundancy circuit active when an input address predecode signal matches a programmed defective address.

Each program circuit includes a plurality of transistors, a determination node, and a plurality of fuses. The plurality of transistors are arranged in one row, corresponding to the plurality of address predecode signal lines. A signal to determine whether a corresponding redundancy circuit is to be rendered active or not is generated at the determination node. The plurality of fuses correspond to the plurality of transistors. Each fuse is connected between the determination node and a corresponding transistor.

The plurality of transistors corresponding to each of the address predecode signal lines in the plurality of program circuits are adjacent to each other.

The semiconductor memory device further includes a plurality of supply lines. The plurality of supply lines correspond to the plurality of address predecode signal lines. Each supply line is provided common to a plurality of transistors adjacent to each other. Each supply line is connected between a corresponding address predecode signal line and the gates of the adjacent transistors.

Since one supply line is provided common to the plural of transistors adjacent to each other in the semiconductor memory device, the number of lines is reduced than in the case where a supply line is provided corresponding to each of the plurality of transistors. More specifically, the interconnection capacitance of an address predecode signal line can be reduced. Accordingly, the size of the transistor driving the address predecode signal line and the transistor in the program circuit can be reduced to allow a smaller layout area for the entire chip.

According to another aspect of the present invention, a semiconductor memory device includes a memory cell array, a predecoder, a decoder, a plurality of address predecode signal lines, and a plurality of repeater circuits. The memory cell array includes a plurality of memory cells arranged in rows and columns. The predecoder predecodes an address signal to generate an address predecode signal. The decoder responds to an address predecode signal to select a row or column in the memory cell array. The plurality of address predecode signal lines are connected between the predecoder and the decoder. The plurality of repeater circuits correspond to the address predecode signal line having a load greater than a predetermined load out of the plurality of address predecode signal lines. Each repeater circuit is connected partway a corresponding address predecode signal line. The decoder is directly connected to the predecoder through the remaining address predecode signal lines.

In the above semiconductor memory device, a repeater circuit is not provided at an address predecode signal line that has a load smaller than a predetermined load. The interconnection capacitance of the address predecode signal line can be reduced corresponding to the load by the repeater circuit. Also, the layout area of the entire chip can be reduced.

According to a further aspect of the present invention, a semiconductor memory device includes a memory cell array, a spare memory cell array, a predecoder, a decoder, a plurality of address predecode signal lines, a plurality of repeater circuits, a spare decoder, and a program circuit. The memory cell array includes a plurality of memory cells arranged in rows and columns. The predecoder predecodes an address signal to generate an address predecode signal. The decoder responds to an address predecode signal to select a row or column in the memory cell array. The plurality of address predecode signal lines are connected between the predecoder and the decoder. The plurality of repeater circuits correspond to the plurality of address predecode signal lines. Each repeater circuit is connected partway a corresponding address predecode signal line. The spare decoder selects a row or column in the spare memory cell array. The program circuit is programmable of a defective address. The program circuit directly receives an address predecode signal from the predecoder to render the spare decoder active when the address predecode signal matches the programmed defective address.

In the above semiconductor memory device, the program circuit directly receives the address predecode signal from the predecoder. Therefore, the determination of whether to render the spare decoder active or not can be ascertained speedily. As a result, the selection of a row or column in a memory cell array is not delayed. Furthermore, the load of the address predecode signal line can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11A–11G are timing charts for describing the operation of the DRAM of FIG. 5.

FIG. 12 is a block diagram showing a structure of another example of the repeater circuit of FIG. 5.

DESCRIPTION OF THE PREFERRED EMBODIMENTS

Figure 1:
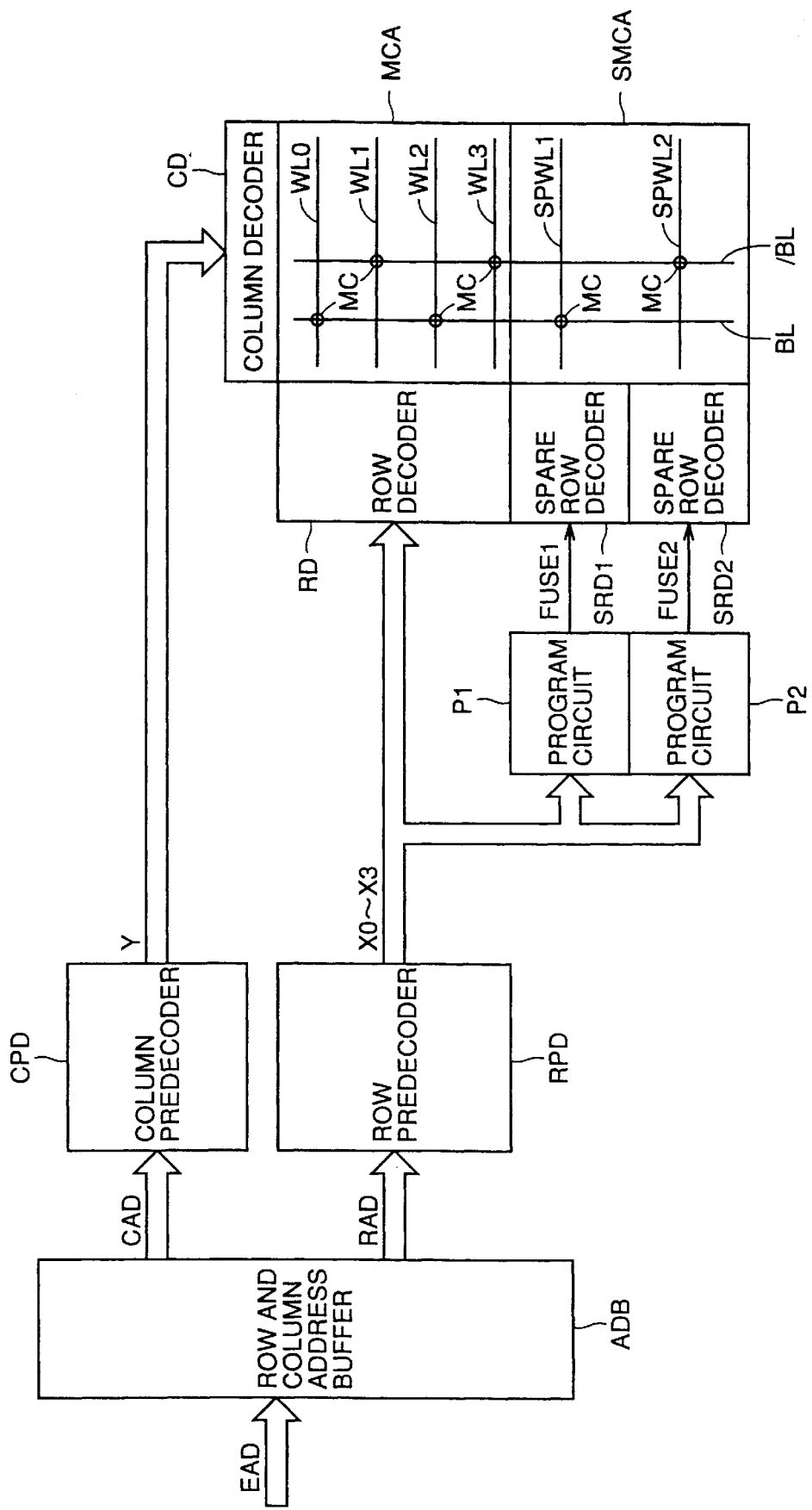
FIG. 1 is a block diagram showing an entire structure of a DRAM according to a first embodiment of the present invention.

Embodiments of the present invention will be described hereinafter with reference to the drawings. The same or corresponding components in the drawings have the same reference characters allotted, and their description will not be repeated.

First Embodiment

Referring to FIG. 1, a DRAM according to a first embodiment of the present invention includes a row and column address buffer ADB, a row predecoder RPD, a column predecoder CPD, a memory cell array MCA, a row decoder RD, a column decoder CD, a spare memory cell array SMCA, spare row decoders SRD1 and SRD2, and program circuits P1 and P2.

Row and column address buffer ADB converts an external address signal EAD into a row address signal RAD or a column address signal CAD. Row predecoder RPD decodes row address signal RAD to generate row address predecode signals X0–X3. Column predecoder CPD decodes column address signal CAD to generate a column address predecode signal Y.

Memory cell array MCA includes a plurality of memory cells MC arranged in rows and columns, a plurality of word lines WL0–WL3 arranged in rows, and a plurality of bit line pairs BL, /BL (here, only BL and /BL are representatively shown) arranged in columns. Row decoder RD responds to row address predecode signals X0–X3 from row predecoder RPD to selectively activate word lines WL0–WL3. Column decoder CD responds to column address predecode signal Y from column predecoder CPD to select bit lines BL and /BL.

Spare memory cell array SMCA includes a plurality of memory cells MC arranged in rows and columns, a plurality of spare word lines SPWL1 and SPWL2 arranged in rows, and a plurality of bit line pairs BL and /BL (here, only BL and /BL are representatively shown) arranged in columns. Spare row decoders SPD1 and SPD2 respond to redundancy activation signals FUSE1 and FUSE2 to render spare word lines SPWL1 and SPWL2, respectively, active.

Program circuit P1 is programmable of the address of a defective word line, and renders spare row decoder SRD1 active when row address predecode signals X0–X3 applied to row decoder RD matches the programmed defective address. Program circuit P2 is programmable of a the address of a defective word line, and renders spare row decoder SRD2 active when row address predecode signal X0–X3 applied to row decoder RD matches the programmed defective address.

Figure 2:
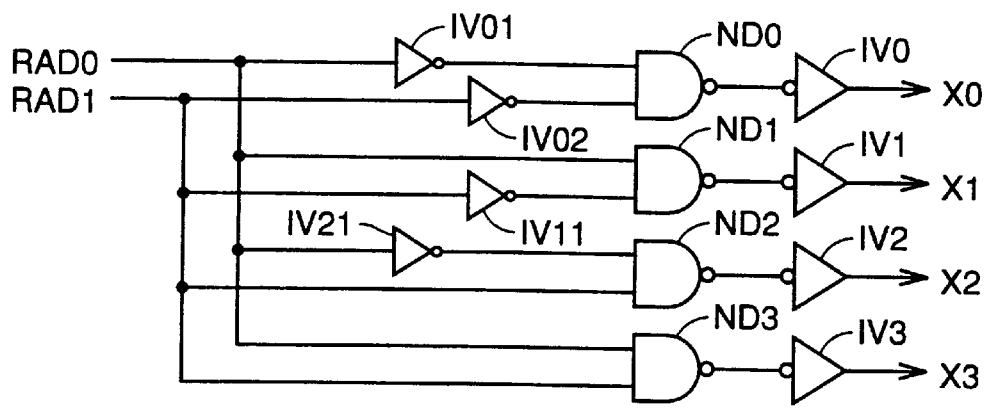
FIG. 2 is a block diagram showing a structure of a row predecoder of FIG. 1.

Referring to FIG. 2, row predecoder RPD includes inverters IV0–IV3, IV01, IV02, IV11, IV21, and NAND circuit ND0–ND3. Inverters IV01 and IV21 invert a bit signal RAD0 of row address signal RAD. Inverters IV02 and IV11 invert a bit signal RAD1 of row address signal RAD. NAND circuit ND0 provides the NAND of the outputs from inverters IV01 and IV02. NAND circuit ND1 provides the NAND of bit signal RAD0 of row address signal RAD and the output of the inverter IV11. NAND circuit ND2 provides the NAND of the output of the inverter IV21 and bit signal RAD1 of row address signal RAD. NAND circuit ND3 provides the NAND of bit signals RAD0 and RAD1 of row address signal RAD. Inverters IV0–IV3 invert the output of NAND circuits ND0–ND3, respectively. The outputs of inverters IV0–IV3 are bit signals X0–X3, respectively, of the row address predecode signal.

According to row predecoder RPD of the above structure, the relationship between bit signals RAD0 and RAD1 of row address signal RAD and bit signals X0–X3 of the row address predecode signal is set forth in the following. When bit signals RAD0 and RAD1 of row address signal RAD is (RAD0, RAD1)=(00), bit signals X0–X3 of the row address predecode signal becomes (X0, X1, X2, X3)=(1000). When bit signals RAD0 and RAD1 of row address signal RAD is (RAD0, RAD1)=(10), bit signals X0–X3 of the row address predecode signal becomes (X0, X1, X2, X3)=(0100). When bit signals RAD0 and RAD1 of row address signal RAD is (RAD0, RAD1)=(01), bit signals X0–X3 of the row address predecode signal becomes (X0, X1, X2, X3)=(0010). When bit signals RAD0 and RAD1 of row address signal RAD is (RAD0, RAD1)=(11), bit signals X0–X3 of the row address predecode signal becomes (X0, X1, X2, X3)=(0001).

Figure 3:
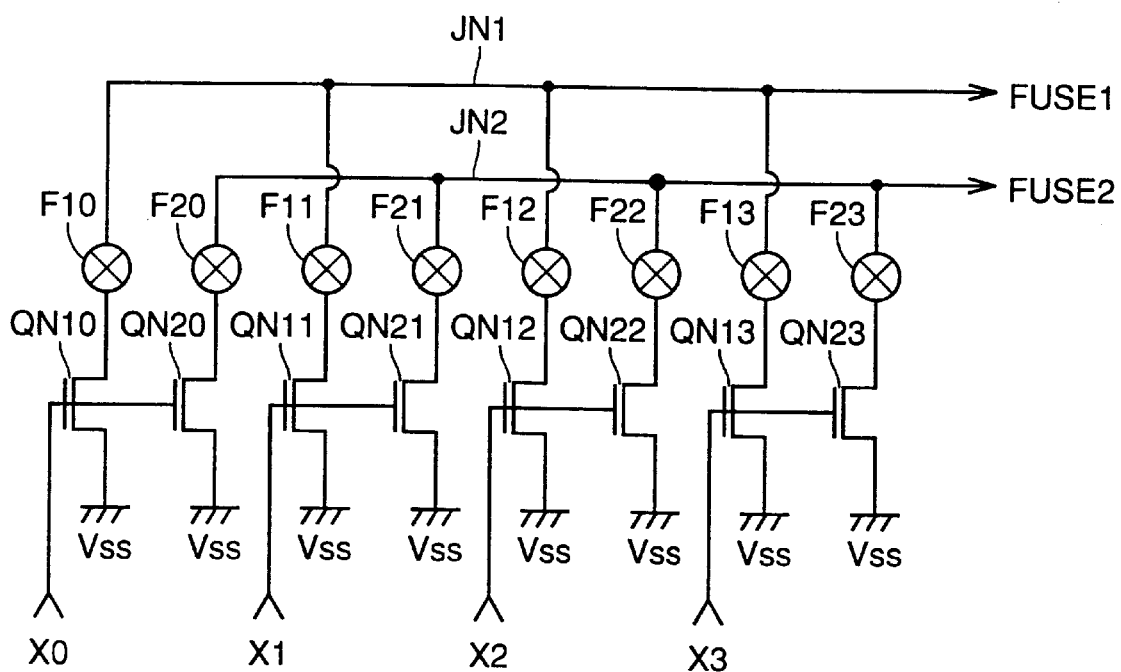
FIG. 3 is a circuit diagram showing a structure of a program circuit of FIG. 1.

FIG. 3 is a circuit diagram showing the structure of program circuits P1 and P2 of FIG. 1. Referring to FIG. 3, program circuit P1 includes a determination node JN1, fuses F10–F13, and N channel MOS transistors QN10–QN13. The voltage of determination node JN1 corresponds to redundancy activation signal FUSE1 to determine whether to render spare row decoder SRD1 active or not. Each of the fuses F10–F13 is connected to determination node JN1. N channel MOS transistors QN10–QN13 are connected between respective corresponding fuses F10–F13 and ground node Vss. Bit signals X0–X3 of the row address predecode signal are applied to the gates of N channel MOS transistors QN10–QN13, respectively. Program circuit P2 includes a determination node JN2, fuses F20–F23, and N channel MOS transistors QN20–QN23. The voltage of determination node JN2 corresponds to redundancy activation signal FUSE2 to determine whether to render spare row decoder SRD2 active or not. Each of fuses F20–F23 is connected to determination node JN2. N channel MOS transistors QN20–QN23 are connected between corresponding fuses F20–F23 and ground node Vss. Bit signals X0–X3 of the row address predecode signal are applied to the gates of N channel MOS transistors QN20–QN23, respectively.

The operation of the above DRAM will be described hereinafter.

Here, it is assumed that row address predecode signals X0–X3 corresponding to defective address FA1 are (X0, X1, X2, X3)=(1000), whereas row address predecode signals X0–X3 corresponding to defective address FA2 is (X0, X1, X2, X3)=(0001).

The fuses corresponding to the signal at an H level out of bit signals X0–X3 of the row address predecode signal corresponding to defective addresses FA1 and FA2, i.e., fuses F10 and F23, are blown out by the laser beam in advance. Thus, each of program circuits P1 and P2 is programmed of defective addresses FA1 and FA2, respectively.

Determination nodes JN1 and JN2 are precharged to the level of a power supply voltage in advance by means such as a precharge circuit.

Under this state, row address predecode signals X0–X3 are applied to N channel MOS transistors QN10–QN13 and QN20–QN23.

When input row address predecode signals X0–X3 do not match any of the preprogrammed defective addresses FA1 and FA2, at least one of N channel MOS transistors QN11–QN13 and QN20–QN22 corresponding to fuses F11–F13 and F20–F22 that are not blowed out out of fuses F10–13 and F20–F23 in program circuits P1 and P2 is turned on. Accordingly, determination nodes JN1 and JN2 are discharged to the level of ground voltage Vss, whereby redundancy activation signals FUSE1 and FUSE2 of an L level are supplied to corresponding spare row decoders SRD1 and SRD2. As a result, row decoder RD is rendered active, whereby word lines WL0–WL3 corresponding to row address predecode signals X0–X3 are selected. Also, spare row decoders SRD1 and SRD2 are rendered inactive.

When input row address predecode signals X0–X3 match preprogrammed defective address FA1, only N channel MOS transistor QN10 corresponding to the blowed-out fuse F10 in program circuit P1 is turned on. Therefore, the voltage of determination node JN1 is maintained at a power supply voltage level, so that redundancy activation signal FUSE1 of an H level is supplied to the spare row decoder. As a result, row decoder RD is rendered inactive, and the spare row decoder is rendered active to select spare word line SPWL1. Thus, the row in the memory cell array corresponding to defective address FA11 is replaced with spare word line SPWL1.

In program circuit P2, N channel MOS transistor QN20 corresponding to fuse F20 that is not blowed out is turned on. Therefore, determination node JN2 is discharged to the level of ground voltage Vss. As a result, redundancy activation signal FUSE 2 of an L level is supplied to the corresponding spare row decoder to render the same inactive.

Similarly, a row in the memory cell array corresponding to defective address FA2 is replaced with spare word line SPWL2 when input row address predecode signals X0–X3 match defective address FA2.

Figure 4:
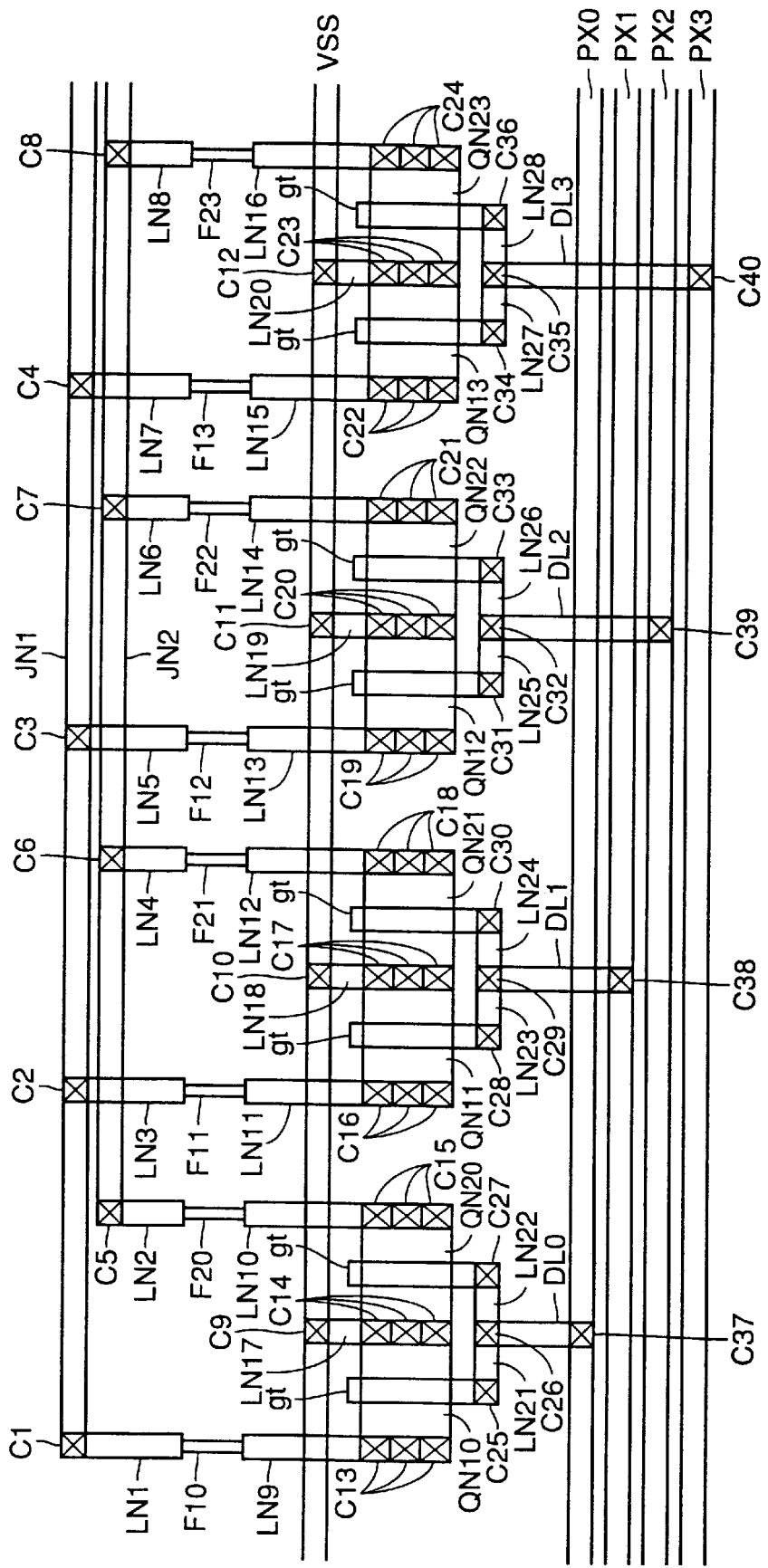
FIG. 4 shows the layout of the arrangement of a program circuit of FIG. 3.

FIG. 4 show the layout of the arrangement of program circuits P1 and P2 of FIG. 3. Referring to FIG. 4, determination nodes JN1 and JN2 and row address predecode signal lines PX0–PX3 are arranged parallel to a ground line Vss that is arranged in a straight line. Row address predecode signals X0–X3 are supplied to row address predecode signal lines PX0–PX3.

N channel MOS transistors QN10–QN13 and QN20–QN23 are arranged in the region between ground line Vss and row address predecode signal lines PX0–PX3, in a row parallel to ground line Vss. N channel MOS transistors QN10 and QN20 are arranged adjacent to each other. Also, N channel MOS transistors QN11 and QN21, N channel MOS transistors QN12 and QN22, and N channel MOS transistors QN13 and QN23 are arranged adjacent to each other, respectively.

A supply line DL0 is arranged in a direction perpendicular to a row address predecode signal line PX0, and electrically connected to row address predecode signal line PX0 through a contact portion C37. Supply line DL0 is also electrically connected to lines LN21 and LN22 through a contact portion C26. Line LN21 is electrically connected to the gate of N channel MOS transistor QN10 through a contact portion C25. Line LN22 is electrically connected to the gate of N channel MOS transistor QN20 through a contact portion C27. Thus, row address predecode signal X0 from row address predecode signal line PX0 is supplied to the gates of N channel MOS transistors QN10 and QN20 via supply line DL0.

Supply line DL1 is arranged in a direction perpendicular to row address predecode signal line PX1, and electrically connected thereto through a contact portion C38. Supply line DL1 is also electrically connected to lines LN23 and LN24 through a contact portion C29. Line LN23 is electrically connected to the gate of N channel MOS transistor QN11 through a contact portion C28. Line LN24 is electrically connected to the gate of N channel MOS transistor QN21 through a contact portion C30. Thus, row address predecode signal X1 from row address predecode signal line PX1 is supplied to the gates of N channel MOS transistors QN11 and QN21 via supply line DL1.

Supply line DL2 is arranged in a direction perpendicular to row address predecode signal line PX2, and electrically connected thereto through a contact portion C39. Supply line DL2 is also electrically connected to lines LN25 and LN26 through a contact portion C32 . Line LN 25 is electrically connected to the gate of N channel MOS transistor QN12 through a contact portion C31. Line LN26 is electrically connected to the gate of N channel MOS transistor QN22 through a contact portion C33. Thus, row address predecode signal X2 from row address predecode signal line PX2 is supplied to the gates of N channel MOS transistors QN12 and QN22 via supply line DL2.

Supply line DL3 is arranged in a direction perpendicular to row address predecode signal line PX3, and electrically connected thereto by a contact portion C40. Supply line DL3 is also electrically connected to lines LN27 and LN28 through a contact portion C35. Line LN 27 is electrically connected to the gate of N channel MOS transistor QN13 through a contact portionC34. Line LN28 is electrically connected to the gate of N channel MOS transistor QN23 through a contact portion C36. Thus, row address predecode signal X3 from row address predecode signal line PX3 is supplied to the gates of N channel MOS transistors QN13 and QN23 via supply line DL3.

Line LN17 is arranged in a direction perpendicular to ground line Vss, and electrically connected thereto through a contact portion C9. Line LN17 is also electrically connected to the sources of N channel MOS transistors QN10 and QN20 through contact portion C14.

Line LN18 is arranged in a direction perpendicular to ground line Vss, and electrically connected thereto through a contact portionC10. Line LN18 is also electrically connected to the sources of N channel MOS transistors QN11 and QN21 through a contact portion C17.

Line LN19 is arranged in a direction perpendicular to ground line Vss, and electrically connected thereto through a contact portion C11. Line LN19 is electrically connected to the sources of N channel MOS transistors QN12 and QN22 through a contact portion C20.

Line LN20 is arranged in a direction perpendicular to ground line Vss and electrically connected thereto through a contact portion C12. Line LN20 is also electrically connected to the sources of N channel MOS transistors QN13 and QN23 through a contact portion C23.

Fuses F10–F13 and F20–F23 are arranged in a row at the region between determination nodes JN1 and JN2 and ground line Vss, parallel to ground line Vss.

Fuse F10 is arranged adjacent to fuse F20. Fuse F10 has one end connected to line LN1 and the other end connected to line LN9. Line LN1 is electrically connected to determination node JN1 through contact portion C1. Line LN9 is electrically connected to the drain of N channel MOS transistor QN10 through contact portion C13.

Fuse F20 is arranged adjacent to fuses F10 and F11. Fuse F20 has one end connected to line LN2 and the other end connected to line LN10. Line LN2 is electrically connected to determination node JN2 through contact portion C5. Line LN10 is electrically connected to the drain of N channel MOS transistor QN20 through contact portion C15.

Fuse F12 is arranged adjacent to fuses F20 and F21. Fuse F1 has one end connected to line LN3 and the other end connected to line LN11. Line LN3 is electrically connected to determination node JN1 through contact portion C2. Line LN11 is electrically connected to the dain of N channel MOS transistor QN11 through contact portion C16.

Fuse F21 is arranged adjacent to fuses F11 and F12. Fuse F21 has one end connected to line LN4 and the other end connected to line LN12. Line LN4 is electrically connected to determination node JN2 through a contact portion C6. Line LN12 is electrically connected to the drain of N channel MOS transistor QN21 through contact portion C18.

Fuse F12 is arranged adjacent to fuses F21 and F22. Fuse F12 has one end connected to line LN5 and the other end connected to line LN13. Line LN5 is electrically connected to determination node JN1 through a contact portion C3. Line LN13 is electrically connected to the drain of N channel MOS transistor QN12 through contact portion C19.

Fuse F22 is arranged adjacent to fuses F12 and F13. Fuse F22 has one end connected to line LN6 and the other end connected to line LN14. Line LN6 is electrically connected to determination node JN2 through contact portion C7. Line LN14 is electrically connected to the drain of N channel MOS transistor QN22 through contact portion C21.

Fuse F13 is arranged adjacent to fuses F22 and F23. Fuse F13 has one end connected to line LN7 and the other end connected to line LN15. Line LN7 is electrically connected to determination node JN1 through contact portion C4. Line LN15 is electrically connected to the drain of N channel MOS transistor QN13 through contact portion C22.

Fuse F23 is arranged adjacent to fuse F13. Fuse F23 has one end connected to line LN8 and the other end connected to line LN16. Line LN8 is electrically connected to determination node JN2 through contact portion C8. Line LN16 is electrically connected to the drain of N channel MOS transistor QN23 through contact portion C24.

In program circuits P1 and P2 of the first embodiment, N channel MOS transistor QN10 and N channel MOS transistor QN20 receiving row address predecode signal X0 from row address predecode signal line PX0 are arranged adjacent to each other. Also, supply line DL0 is provided common to N channel MOS transistors QN10 and QN20 to which row address predecode signal X0 is supplied to the gates thereof. Therefore, the interconnection is reduced in comparison with the conventional program circuit where a line for supplying row address predecode signal X0 from row address predecode signal line PX0 is provided for each of N channel MOS transistors QN10 and QN20. In other words, the interconnection capacitance of row address predecode signal line PX0 can be reduced. Similarly, the interconnection capacitance of row address predecode signal lines PX1–PX3 can be reduced. Accordingly, the size of the transistor driving the row address predecode signal line and the transistor included in the program circuit can be reduced to allow a smaller layout area for the entire chip.

In the present embodiment, the number of program circuits provided corresponding to the defective address is 2. The present invention is similarly applicable to the case where the number of program circuits is greater or smaller.

Also, the present invention is not limited to the number of four row address predecode signal lines as in the present embodiment, and can be applied to the case where more or fewer row address predecode signal lines are provided.

The present invention is also applicable to the case where a row address predecode signal is not used and a row address signal is directly applied to the program circuit.

Furthermore, the present invention is similarly applicable to a structure where the program circuit, spare column decoder, and spare column select line are provided in the column direction.

Second Embodiment

Figure 5:
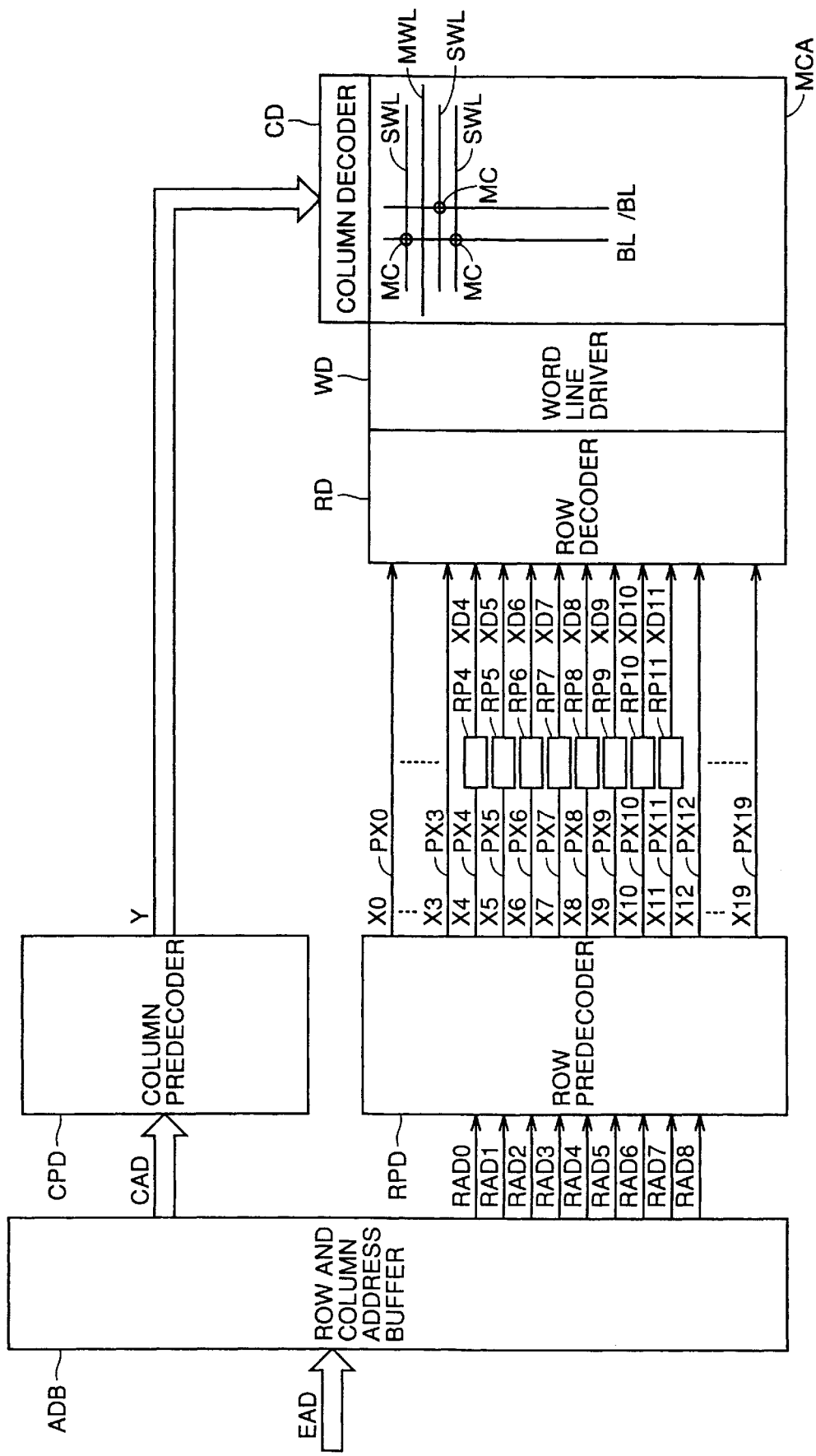
FIG. 5 is a block diagram showing an entire structure of a DRAM according to a second embodiment of the present invention.

Referring to FIG. 5, a DRAM according to a second embodiment of the present invention includes the row and column address buffer ADB, a row predecoder RPD, a column predecoder CPD, row address predecode signal lines PX0–PX19, repeater circuits RP4–RP11, a memory cell array MCA, a row decoder RD, a word line driver WD, and a column decoder CD.

Row and column address buffer ADB converts an external address signal EAD into row address signals RAD0–RAD8 or a column address signal CAD. Row predecoder RPD decodes row address signals RAD0–RAD8 to generate row address predecode signals X0–X19. Each of row address predecode signal line PX0–PX19 is provided between row predecoder RPD and row decoder RD to receive corresponding row address predecode signals X0–X19. Repeater circuits RP4–RP11 are connected to corresponding row address predecode signal lines PX4–PX11 to amplify and shape the waveform of corresponding row address predecode signals X4–X11 to supply the shaped signals to row decoder RD as row address predecode signals XD4–XD11.

Memory cell array MCA includes a plurality of memory cells MC arranged in rows and columns, a plurality of main word lines MWL arranged in rows, a plurality of subword lines SWL provided corresponding to the plurality of main word lines, respectively, and a plurality of bit line pairs BL, /BL arranged in columns. Row decoder RD responds to row address predecode signals X0–X19 from row predecoder RPD to selectively render main word line MWL active. Word line driver WD selectively activates the plurality of subword lines SWL provided corresponding to main word line MWL. Column decoder CD responds to column address predecode signal Y from column predecoder CPD to select bit lines BL and /BL.

Figure 6:
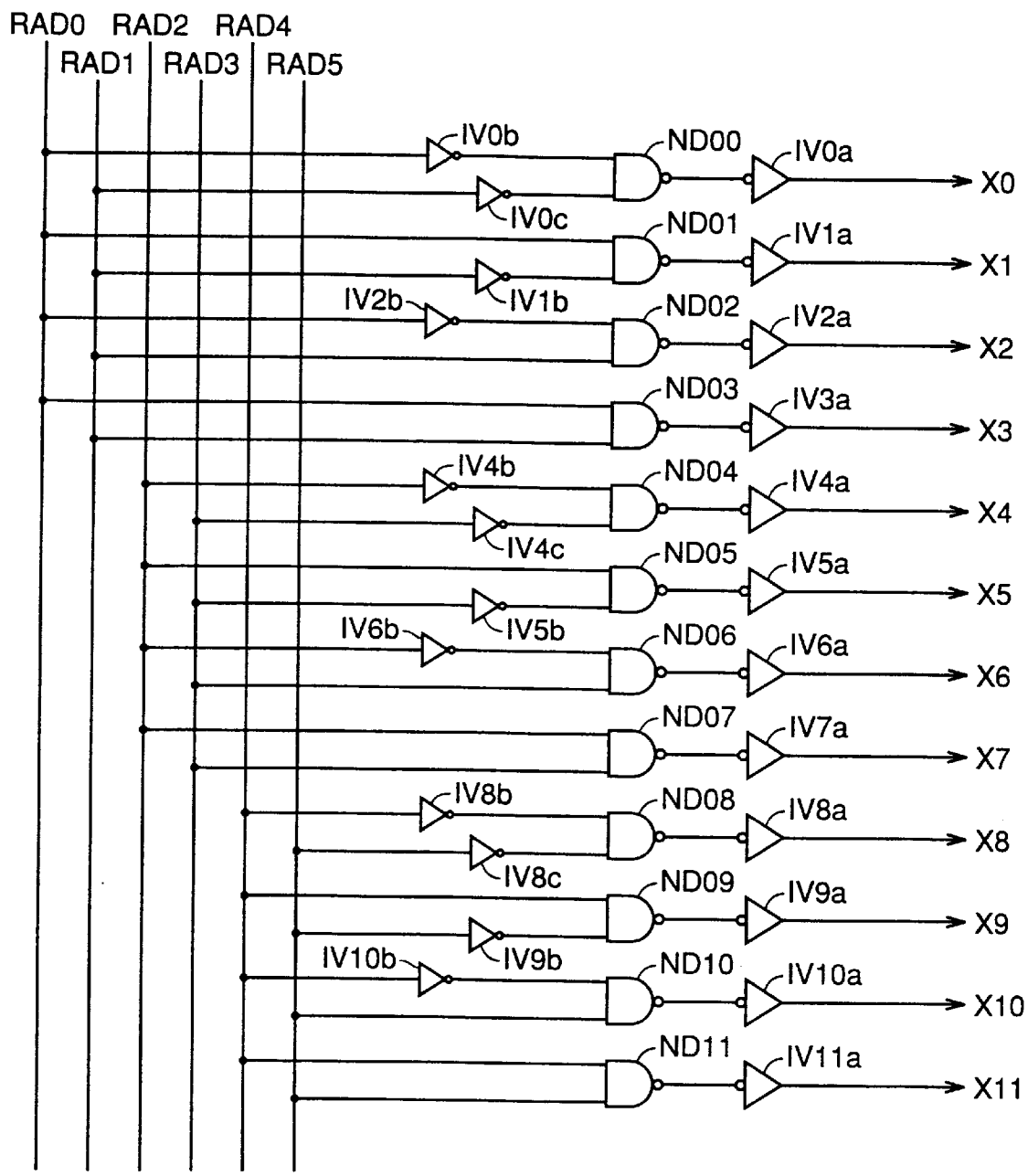
FIGS. 6 and 7 are block diagrams showing a structure of a row predecoder of FIG. 5.
Figure 7:
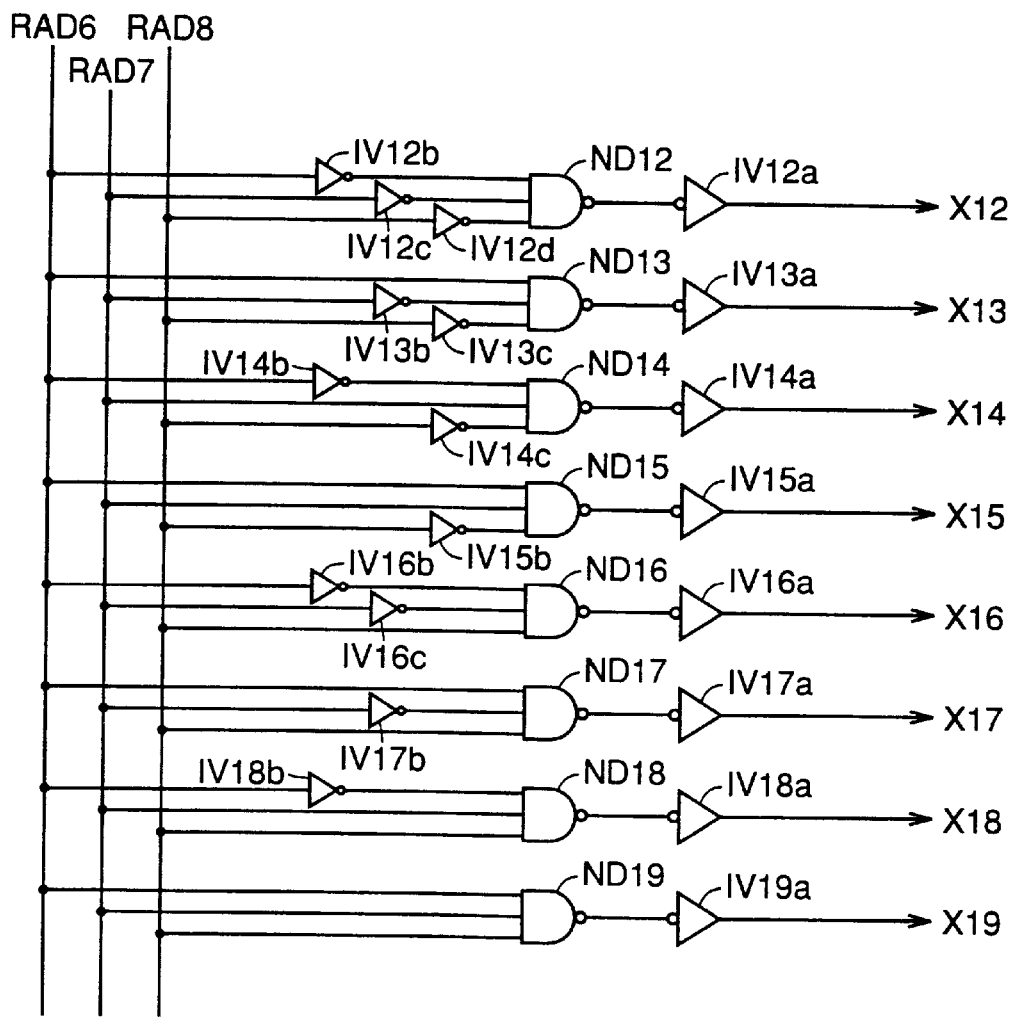

FIGS. 6 and 7 are block diagrams showing the structure of row predecoder RPD of FIG. 5. Referring to FIGS. 6 and 7, this row predecoder includes inverters IV0a–IV19a, IV0b, IV0c, IV1b, IV2b, IV4b, IV4c, IV5b, IV6b, IV8b, IV8c, IV9b, IV10b, IV12b IV12c, IV12d, IV13b, IV13c, IV14b, IV14c, IV15b, IV16b, IV16c, IV17b, IV18b and NAND circuits ND00–ND19.

Inverters IV0b and IV2b invert row address signal RAD0. Inverters IV0c and IV1b invert row address signal RAD1. Inverters IV4b and IV6b invert row address signal RAD2. Inverters IV4c and IV5b invert row address signal RAD3. Inverters IV8b and IV10b invert row address signal RAD4. Inverters IV8c and IV9b invert row address signal RAD5. Inverters IV12b, IV14b, IV16b and IV18b invert row address signal RAD6. Inverters IV12c, IV13b, IV16c and IV17b invert row address signal RAD7. Inverters IV12d, IV13c, IV14c and IV15b invert row address signal RAD8.

NAND circuit ND00 provides the NAND of the outputs of inverters IV0b and IV0c. NAND circuit ND01 provides the NAND of row address signal RAD0 and the output of inverter IV1b. NAND circuit ND02 provides the NAND of the output of inverter IV2b and row address signal RAD1. NAND circuit ND03 provides the NAND of row address signals RAD0 and RAD1. NAND circuit ND04 provides the NAND of the outputs of inverters IV4b and IV4c. NAND circuit ND05 provides the NAND of row address signal RAD2 and the output of inverter IV5b. NAND circuit ND06 provides the NAND of the output of inverter IV6b and row address signal RAD3. NAND circuit ND07 provides the NAND of row address signals RAD2 and RAD3. NAND circuit ND08 provides the NAND of the outputs of inverters IV8b and IV8c. NAND circuit ND09 provides the NAND of row address signal RAD4 and the output of inverter IV9b. NAND circuit ND10 provides the NAND of the output of inverter IV10b and row address signal RAD5. NAND circuit ND11 provides the NAND of row address signals RAD4 and RAD5. NAND circuit ND12 provides the NAND of the outputs of inverters IV12b, IV12c and IV12d. NAND circuit ND13 provides the NAND of row address signal RAD6 and the outputs of inverters IV13b and IV13c. NAND circuit ND14 provides the NAND of row address signal RAD7 and the output of inverters IV14b and IV14c. NAND circuit ND15 provides the NAND of row address signals RAD6 and rAD7 and the output of inverter IV15b. NAND circuit ND16 provides the NAND of the outputs of inverters IV16b and IV16c and row address signal RAD8. NAND circuit ND17 provides the NAND of row address signals RAD6 and RAD8 and the output of inverter IV17b. NAND circuit ND18 provides the NAND of the output of inverter IV18b and row address signals RAD7 and RAD8. NAND circuit ND19 provides the NAND of row address signals RAD6, RAD7 and RAD8.

Inverters IV0a–IV19a invert the outputs of NAND circuit ND00–ND19, respectively. The outputs of the inverters IV0a–IV19a function as row address predecode signals X0–X19, respectively.

Figure 8:
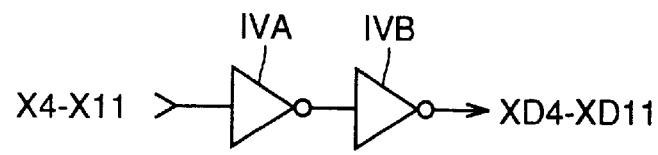
FIG. 8 is a block diagram showing an example of a repeater circuit of FIG. 5.

FIG. 8 is a block diagram showing the structure of repeater circuits RP4–RP11 of FIG. 5. Referring to FIG. 8, repeater circuits RP4–RP11 include inverters IVA and IVB. Inverter IVA inverts row address predecode signals X4–X11. Inverter IVB inverts the output of inverter IVA. The output of inverter IVB becomes respective row address predecode signals XD4–XD11. By repeater circuits RP4–RP11, input row address predecode signals X4–X11 are amplified and have their waveform shaped.

Figure 9:
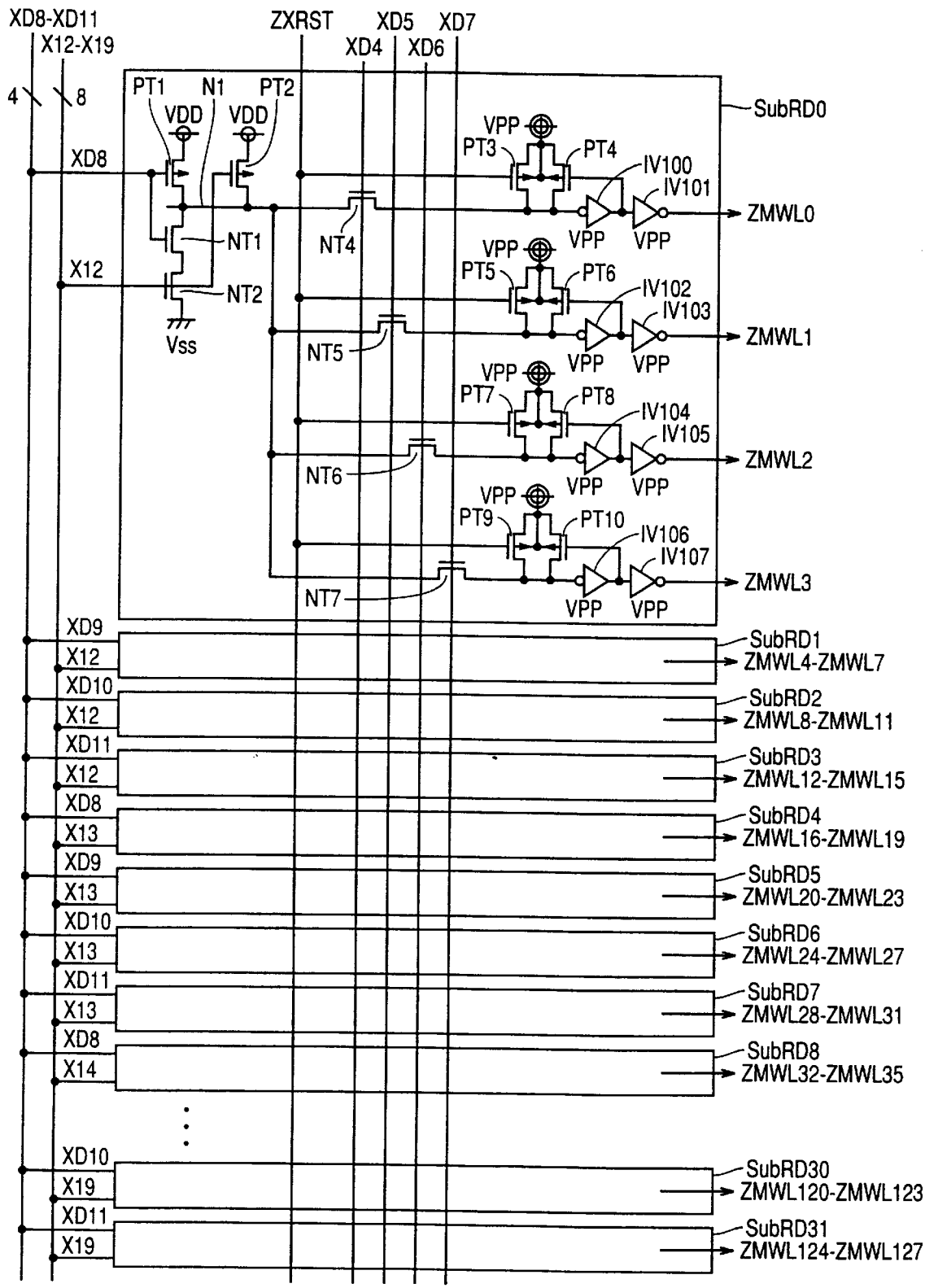
FIG. 9 is a block diagram showing the structure of a row decoder in FIG. 5.

FIG. 9 is a block diagram showing a structure of row decoder RD of FIG. 5. Referring to FIG. 9, row decoder RD includes subrow decoders SubRD0–SubRD31.

Subrow decoder SubRD0 includes P channel MOS transistors PT1–PT10, N channel MOS transistors NT1, NT2, and NT4–NT7, and invertersIV100–IV107.

P channel MOS transistor PT1 and N channel MOS transistors NT1 and NT2 are connected in series between a power supply node VDD and a ground node Vss. P channel MOS transistor PT1 is connected between power supply node VDD and N channel MOS transistor NT1 to receive row address predecode signal XD8 at its gate. N channel MOS transistor NT1 is connected between P channel MOS transistor PT1 and N channel MOS transistor NT2 to receive row address predecode signal XD8 at its gate. N channel MOS transistor NT2 is connected between N channel MOS transistor NT1 and ground node Vss to receive row address predecode signal X12 at its gate. P channel MOS transistor PT2 is connected between a connection node N1 of P channel MOS transistor PT1 and N channel MOS transistor NT1 and power supply node VDD, and receives row address predecode signal X12 at its gate.

N channel MOS transistor NT4 is connected between connection node N1 and the drain of P channel MOS transistor PT3 to receive row address predecode signal XD4 at its gate. P channel MOS transistor PT3 is connected between a boost node Vpp and N channel MOS transistor NT4 to receive signal ZXRST at its gate. P channel MOS transistor PT3 is diode-connected. The boost node is charged to a level of voltage Vpp higher than power supply voltage VDD. P channel MOS transistor PT4 is connected between boost node Vpp and N channel MOS transistor NT4, in parallel to P channel MOS transistor PT3 to receive the output of inverter IV100 at its gate. P channel MOS transistor PT4 is diode-connected. Inverter IV100 is connected between boost node Vpp and the ground node to invert the voltage of the interconnection node of N channel MOS transistor NT4 and P channel MOS transistors PT3 and PT4. Inverter IV101 is connected between boost node Vpp and the connection node to invert the output of inverter IV100. The output of inverter IV101 becomes main word line activation signal ZMWL0.

N channel MOS transistor NT5 is connected between connection node N1 and the drain of P channel MOS transistor PT5 to receive row address predecode signal XD5 at its gate. P channel MOS transistor PT5 is connected between boost node Vpp and N channel MOS transistor NT5 to receive signal ZXRST at its gate. P channel MOS transistor PT5 is diode-connected. P channel MOS transistor PT6 is connected between boost node Vpp and N channel MOS transistor NT5, in parallel to P channel MOS transistor PT5 to receive the output of inverter IV102 at its gate. P channel MOS transistor PT6 is diode-connected. Inverter IV102 is connected between boost node Vpp and the ground node to invert the voltage of the interconnection node of N channel MOS transistor NT5 and of P channel MOS transistors PT5 and PT6. Inverter IV103 is connected between boost node Vpp and the ground node to invert the output of inverter IV102. The output of inverter IV103 becomes main word line activation signal ZMWL1.

N channel MOS transistor NT6 is connected between connection node N1 and the drain of P channel MOS transistor PT7 to receive row address predecode signal XD6 at its gate. P channel MOS transistor PT7 is connected between boost node Vpp and N channel MOS transistor NT6 to receive signal ZXRST at its gate. P channel MOS transistor PT7 is diode-connected. P channel MOS transistor PT8 is connected between boost node Vpp and N channel MOS transistor NT6, parallel to P channel MOS transistor PT7, to receive the output of the inverter IV104 at its gate. P channel MOS transistor PT8 is diode-connected. Inverter IV104 is connected between boost node Vpp and the ground node to invert the voltage of the interconnection node of N channel MOS transistor NT6 and of P channel MOS transistors PT7 and PT8. Inverter IV105 is connected between boost node Vpp and the ground node to invert the output of inverter IV104. The output of inverter IV105 becomes main word line activation signal ZMWL2.

N channel MOS transistor NT7 is connected between connection node N1 and the drain of P channel MOS transistor PT9 to receive row address predecode signal XD7 at its gate. P channel MOS transistor PT9 is connected between boost node Vpp and N channel MOS transistor NT7 to receive signal ZXRST. P channel MOS transistor PT9 is diode-connected. P channel MOS transistor PT 10 is connected between boost node Vpp and N channel MOS transistor NT7, parallel to P channel MOS transistor PT9 to receive the output of inverter IV106 at its gate. P channel MOS transistor PT10 is diode-connected. Inverter IV106 is connected between boost node Vpp and the ground node to invert the voltage of the interconnection node of N channel MOS transistor NT7 and of P channel MOS transistors PT9 and PT10. Inverter IV107 is connected between boost node Vpp and the ground node to invert the output of inverter IV106. The output of inverter IV107 becomes main word line activation signal ZMWL3.

Subrow decoders SubRD1–SubRD31 each having a structure similar to that of the above-described subrow decoder SubRD0 are provided. Each of subrow decoders SubRD1–SubRD31 receives corresponding row address predecode signals XD8–XD11, and X12–X19 to generate corresponding main word line activation signals ZMWL4–ZMWL127, respectively.

Figure 10:
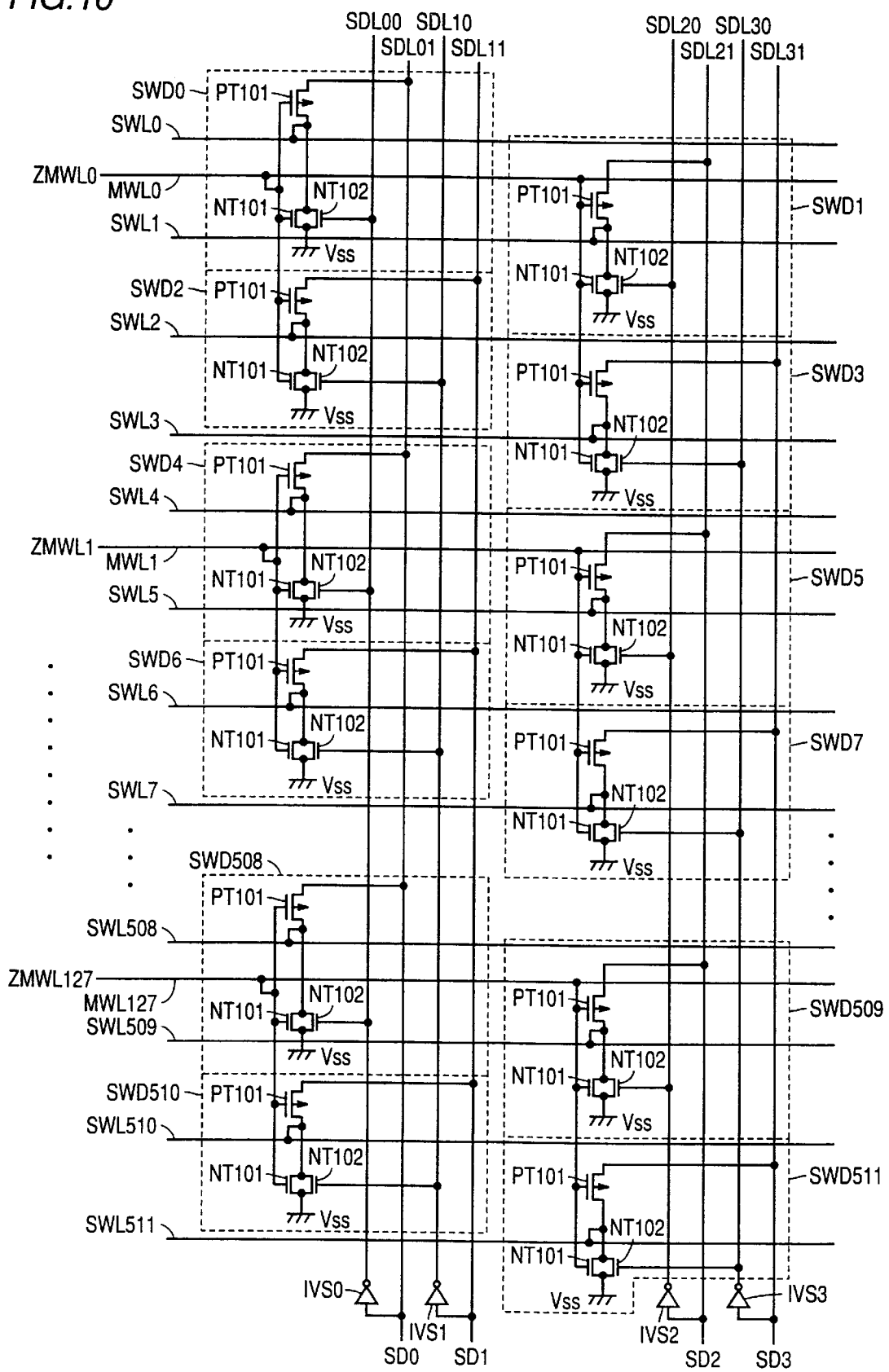
FIG. 10 is a block diagram showing the structure of a word line driver in FIG. 5.

FIG. 10 is a block diagram showing the structure of word line driver WD of FIG. 5. Referring to FIG. 10, word line driver WD includes subword line drivers SWD0–SWD511.

In the present DRAM, the word lines are provided in a hierarchical manner, including subword lines SWL (i×4) –SWL (i×4+4) for each main word line MWLi (i=0–127). Although not shown in FIG. 5, segment decode signal lines SDL00–SDL30, SDL01–SDL31 and inverters IVS0–IVS3 are provided. Segment decode signals SD0–SD3 are supplied to segment decode lines SDL01–SDL31. Signals /SD0–/SD3 which are inverted versions of segment decode signals SD0–SD3 are supplied to segment decode lines SDL00–SDL30. Inverters IVS0–IVS3 invert segment decode signals SD0–SD3.

Subword line drivers SWD0–SWD5 11 are provided corresponding to subword lines SWL0–SWL511, respectively. Each of subword line drivers SWD(i×4)–SWL (i×4+ 4) (i=0–127) includes a P channel MOS transistor PT101 and N channel MOS transistors NT101 and NT102.

In subword line driver SWL (i×4) (i=0–127), P channel MOS transistor PT101 and N channel MOS transistor NT101 are connected in series between a segment decode line SDL01 and ground node Vss to receive main word line activation signal ZMWLi at its gate. The connection node of P channel MOS transistor PT101 and N channel MOS transistor NT101 is connected to subword line SWL(i×4). N channel MOS transistor NT102 is connected in parallel to N channel MOS transistor NT101, between the connection node of P channel MOS transistor PT101 and N channel MOS transistor NT101 and ground node Vss, and has its gate connected to segment decode line SDL00.

In subword line driver SWD (i×4+1) (i=0–127), P channel MOS transistor PT101 and N channel MOS transistor NT101 are connected in series between segment decode line SDL21 and ground node Vss to receive main word line activation signal ZMWLi at its gate. The connection node of P channel MOS transistor PT101 and N channel MOS transistor NT101 is connected to subword line SWL(i×4+1). N channel MOS transistor NT102 is connected in parallel to N channel MOS transistor NT101, between the connection node of P channel MOS transistor PT101 and N channel MOS transistor NT101 and ground node Vss, and has its gate connected to a segment decode line SDL20.

In subword line driver SWD (i×4+2) (i=0–127), P channel MOS transistor PT101 and N channel MOS transistor NT101 are connected in series between segment decode line SDL11 and ground node Vss to receive main word line activation signal ZMWLi at its gate. The connection node of P channel MOS transistor PT101 and N channel MOS transistor NT101 is connected to subword line SWL(i×4+2). N channel MOS transistor NT102 is connected in parallel to N channel MOS transistor NT101, between the connection node of P channel MOS transistor PT 101 and N channel MOS transistor NT101 and ground node Vss, and has its gate connected to segment decode line SDL10.

In subword line driver SWD (i×4+3) (i=0–127), P channel MOS transistor PT101 and N channel MOS transistor NT101 are connected in series between segment decode line SDL31 and ground node Vss to receive main word line activation signal ZMWLi at its gate. The connection node of P channel MOS transistor PT101 and N channel MOS transistor NT101 is connected to subword line SWL(i×4+3). N channel MOS transistor NT102 is connected between the connection node of P channel MOS transistor PT101 and N channel MOS transistor NT101 and ground node Vss, parallel to N channel MOS transistor NT101, and has a gate connected to segment decode line SDL30.

The operation of the above DRAM will be described hereinafter with reference to FIG. 11. Here, the access of memory cell MC on subword line SWL0 will be taken as an example.

In response to the rise of external clock signal ext.CLK at time t1, an external row address strobe signal ext./RAS falls for a predetermined time. In response, signal ZXRST is driven to an H level. As a result, P channel MOS transistors PT3, PT5, PT7 and PT9 in subrow decoders SubRD0–SubRD31 of FIG. 9 are turned off. In response to external row address strobe signal ext./RAS falling down for a predetermined time, row address predecode signals XD4, XD8 and XD12 are pulled up to an H level. As a result, N channel MOS transistors NT1 and NT2 in subrow decoder SubRD0 are turned on whereas P channel MOS transistor PT2 is turned off. Therefore, connection node N1 attains an L level. Also, since N channel MOS transistor NT4 is turned on, main word line activation signal ZMWL0 attains an L level.

In response to main word line activation signal ZMWL0 of an L level, P channel MOS transistor PT101 is turned on whereas N channel MOS transistor NT101 is turned off in subword line driver SWD0. Also, segment decode signal SD0 attains an H level, and subword line SWL0 attains an H level through P channel MOS transistor PT101. Then, bit lines BL and /BL are selected by the column decoder, whereby memory cell MC on subword line SWL0 is accessed.

A similar access is effected for a memory cell MC on the subword lines besides subword line SWL0.

In the DRAM of the second embodiment, repeater circuits RP4–RP11 are provided for column address predecode signals X4–X11 out of row address predecode signals X0–X19. However, a repeater circuit is not provided for row address predecode signals X0–X3 and X12–X19. The reason thereof will be described now.

In general, since an address predecode signal line is arranged lengthily on a chip, the load of the interconnection capacitance is increased. The address predecode signal is used as a block select signal, a word line activation signal, and the like to be applied to the gates of the transistors included in the block select circuit, the word line driver, and the like. Therefore, the drivability of the address predecode signal must be increased. A repeater circuit is generally provided for this purpose with respect to all address predecode signal lines.

However, the driving load of an address predecode signal line is reduced in accordance with the recent reduction in the chip area and the wiring scheme of the address predecode signal line. It is therefore not appropriate to provide a repeater circuit for all of address predecode signal lines. This is because the provision of a repeater circuit may delay the transmission of an address predecode signal depending upon the driving load of the address predecode signal line.

Referring to FIG. 9 again, the transistors driven by row address predecode signal X8, i.e., by row address predecode signal XD8, are P channel MOS transistor PT1 and N channel MOS transistor NT1 included in subrow decoder SubRD (4×k) (k=0–7). When the gate capacitance of P channel MOS transistor PT1 and N channel MOS transistor NT1 is C1, the total gate capacitance Cg1 of the transistors driven by row address predecode signal XD8 is Cg1=C1×8. The same applies to the other row address predecode signals XD9–XD11.

The transistors driven by row address predecode signals X4–X7, i.e., by row address predecode signals XD4–XD7, are N channel MOS transistors NT4–NT7 included in respective subrow decoder SubRDi (i=0–31). When the gate capacitance of N channel MOS transistors NT4–NT7 is C2, the total gate capacitance Cg2 of the transistors driven by row address predecode signals XD4–XD7 is Cg2=C2×32.

The transistors driven by row address predecode signal X12 are P channel MOS transistor PT2 and N channel MOS transistor NT2 included in subrow decoders SubRD0–SubRD3. When the gate capacitance of P channel MOS transistor PT2 and N channel MOS transistor NT2 is C3, the total gate capacitance Cg3 of the transistors driving row address predecode signal X12 becomes Cg3=C3×4. The same applies to row address predecode signals X12–X19.

When C1=C2=C3 for the above gate capacitances C1, C2 and C3 for the sake of simplification, Cg3<Cg1<Cg2 is established. It is therefore appreciated that the driving load of each row address predecode signal line differs.

It is assumed that the time for propagating a row address predecode signal from row predecoder RPD to repeater circuits RP4–RP11 is t1, the time for propagation within a repeater circuit is t2, and the time for propagation from a repeater circuit to row decoder RD is t3, and the interconnection capacitance of the row address predecode signal line is Cw. The time for propagation of a row address signal directly from row predecoder RPD to the column decoder without the provision of a repeater circuit is (Cg+Cw)×R (R is a constant).

Therefore, there is an advantage that the propagation time can be shortened by providing a repeater circuit when the relationship of t1+t2+t3<(Cg+Cw)×R is satisfied. However, when the above relationship is not satisfied, the provision of a repeater circuit will not be advantageous and will induce extra load caused by the repeater circuit and the corresponding wiring. Therefore, provision of a repeater circuit in such a case will hinder reduction in the chip cost and the layout area. The row address predecode signal should be supplied directly to the row decoder without provision of a repeater circuit.

In view of the foregoing, repeater circuits RP4–RP11 are provided corresponding to row address predecode signal lines PX4–PX11 of a large load whereas a repeater circuit is not provided for predecode signal lines X0–X3 and X12–X19 of a small load in the second embodiment. Thus, the load of row address predecode signal lines X0–X3 and X12–X19 can be reduced and the layout area can also be made smaller.

The structure of repeater circuit RP4–RP11 is not limited to that shown in FIG. 8, and can be formed of the NAND circuit NDC and the inverter circuit IVC shown in FIG. 12. In this case, row address predecode signal Xi can be applied to one input and enable signal RXi can be applied to the other input of NAND circuit NDC.

Although the repeater circuit is provided only with respect to a row address predecode signal line, a repeater circuit can similarly be provided with respect to a column address predecode signal line.

Third Embodiment

Figure 13:
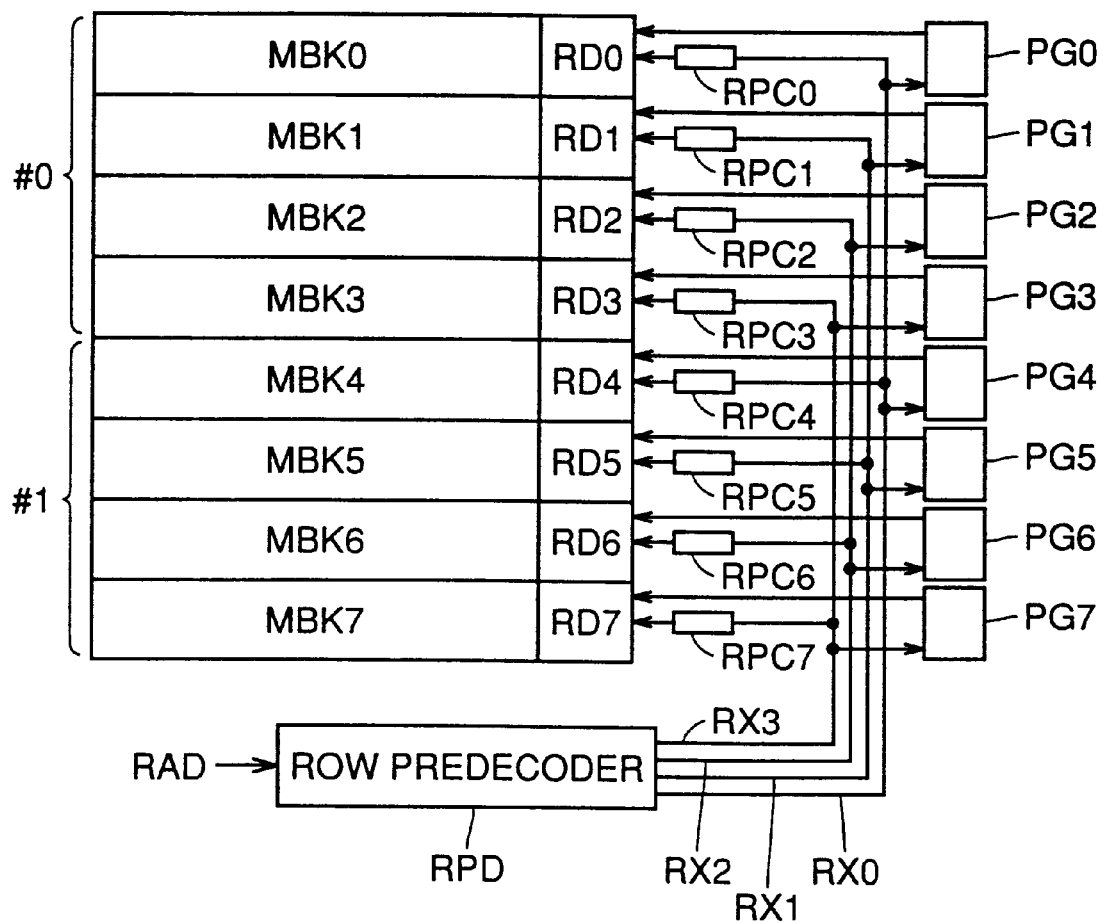
FIG. 13 is a block diagram showing an entire structure of a DRAM according to a third embodiment of the present invention.
Figure 14:
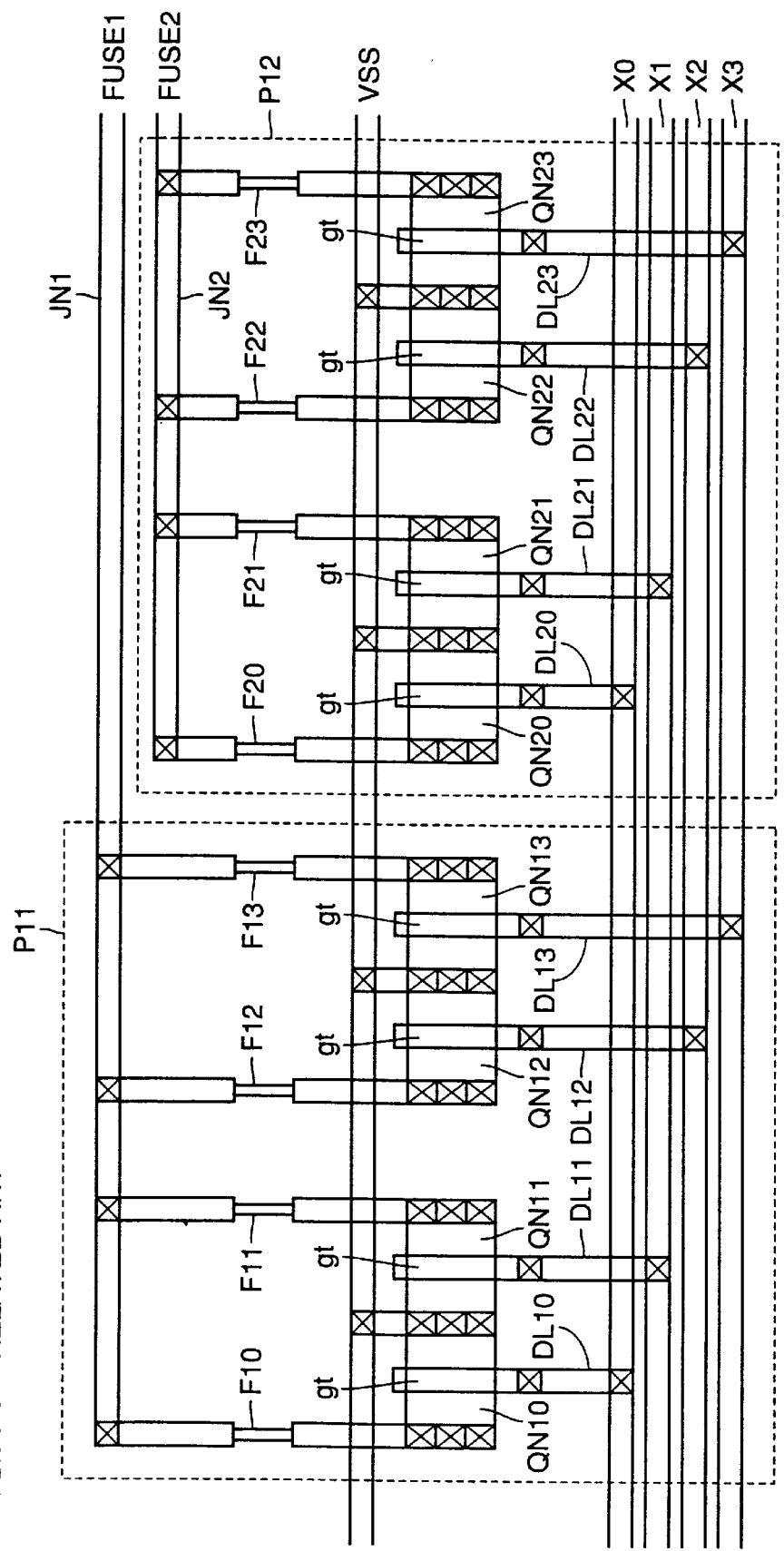
FIG. 14 shows the layout of the arrangement of a conventional program circuit.

Referring to FIG. 13, a DRAM according to a third embodiment of the present invention includes memory banks #0 and #1, a row predecoder RPD, row address predecode signal lines RX0–RX3, repeater circuits RPC0–RPC7, program circuits PG0–PG7, and row decoders RD0–RD7.

Memory banks #0 and #1 include memory blocks MBK0–MBK3 and memory blocks MBK4–MBK7, respectively. Each of memory blocks MBK0–MBK7 includes a plurality of memory cells (not shown) arranged in rows and columns, a plurality of word lines (not shown) arranged in rows, a spare word line (not shown) arranged in rows, and a plurality of bit line pairs (not shown) arranged in columns. Memory banks #0 and #1 are selectively rendered active by a bank select signal. Row predecoder RPD decodes row address signal RAD to generate a row address predecode signal. Row address predecode signal lines RX0–RX3 are provided corresponding to row decoders RD0–RD7 and program circuits PG0–PG7, respectively, to supply a row address predecode signal from row predecoder RPD to corresponding row decoders RD0–RD7 and program circuits PG0–PG7. Repeater circuits RPC0–RPC7 are provided corresponding to row address predecode signal lines RX0–RX3, respectively, to amplify and supply to a corresponding main row decoder a corresponding row address predecode signal. Each of program circuits PG0–PG7 is programmable of a defective address, and directly receives a row address predecode signal from row predecoder RPD to supply an active redundancy determination signal to a corresponding spare row decoder when the received row address predecode signal matches the programed defective address. Each of row decoders RD0–RD7 includes a main row decoder (not shown) and a spare row decoder (not shown). The main row decoder responds to a row address predecode signal from corresponding repeater circuits RPC0–RPC7 to select a word line in memory blocks MBK0–MBK7, respectively. The spare row decoder responds to a redundancy determination signal from corresponding program circuits PG0–PG7 to select a spare word line.

The operation of the above DRAM will be described hereinafter taking the access of memory block MBK0 as an example.

Memory bank #0 is selected by a bank select signal. Then, memory block MBK0 is selected by a block select signal. The row address predecode signal from row predecoder RPD passes through row address predecode signal line RX0 to be supplied to repeater circuit RPC0 and program circuit PG0. Repeater circuit RPC0 amplifies the row address predecode signal and supplies the amplified signal to the main row decoder in row decoder RD0. Program circuit PG0 compares the input row address predecode signal with a preprogrammed defective address. When the comparison shows a unmatch, an inactive redundancy determination signal is supplied to row decoder RD0, whereby the spare row decoder is rendered inactive and the main row decoder is rendered active. As a result, a word line in the memory block is selected by the main row decoder. A column is selected by the column decoder (not shown), whereby a desired memory cell is accessed. When the comparison by program circuit PG0 results in a match, an active redundancy determination signal is supplied to row decoder RD0, whereby the spare row decoder is rendered active and the main row decoder is rendered inactive. A spare word line is selected by the spare row decoder, and a column is selected by the column decoder. By the selection of a spare memory cell on the spare word line, the defective memory cell can be repaired.

In the present third embodiment, the row address predecode signal is directly input to program circuits PG0–PG7 without passing through repeater circuits RPC0–RPC7. Therefore, the determination result of program circuits PG0–PG7, i.e., the redundancy determination signal, can be supplied faster corresponding to the delay time caused by repeater circuits RPC0–RPC7. Therefore, the problem of the selection of a word line being delayed by the supply of a redundancy determination circuit from program circuits PG0–PG7 being delayed will not occur. Furthermore, the load of the row address predecode signal line can be reduced.

The structure shown in FIGS. 8 and 12 can be applied for repeater circuits RPC0–RPC7.

Furthermore, by employing a structure similar to that shown in the first embodiment for program circuits PG0–PG7, the load of the row address predecode signal line can further reduced to become more efficient.

The present invention is not limited to the embodiment for a row address predecode signal line, and is similarly applicable to a column address predecode signal line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
 a decoder generating an address predecode signal of a plurality of bits in response to an address signal;
 a plurality of address predecode signal lines corresponding to the plurality of bits of said address predecode signal, each address predecode signal line transmitting a signal of a corresponding bit of said address predecode signal; and
 a plurality of program circuits corresponding to a plurality of redundancy circuits, each program circuit being programmable of a defective address, and rendering a corresponding redundancy circuit active when an input address predecode signal matches the programmed defective address, each of said program circuits including
  a plurality of transistors, corresponding to said plurality of address predecode signal lines,
  a determination node from which a signal is generated to determine whether to render said corresponding redundancy circuit active or not, and
  a plurality of fuses corresponding to said plurality of transistors, each fuse being connected between said determination node and a corresponding transistor, wherein
   first plurality of transistors corresponding to each of said address predecode signal lines in a first program circuit are each located adjacent to a respective transistor of a second plurality of transistors included in a second program circuit;
 said semiconductor memory device further comprising;
  a plurality of supply lines corresponding to said plurality of address predecode signal lines, each supply line common to a transistor of the first program circuit and a transistor of the second program circuit located adjacent to each other, and connected between a corresponding address predecode signal line and gates of the transistors of the first and second program circuits located adjacent to each other.

2. The semiconductor memory device according to claim 1, wherein a plurality of fuses corresponding to each of said address predecode signal lines in said plurality of program circuits are adjacent to each other.

3. A semiconductor memory device comprising:
 a memory cell array including a plurality of memory cells arranged in rows and columns;
 a predecoder predecoding an address signal to generate an address predecode signal;
 a decoder responsive to said address predecode signal to select a row or column in said memory cell array;
 a plurality of address predecode signal lines connected between said predecoder and said decoder; and
 a plurality of repeater circuits corresponding to address predecode signal lines each having a load greater than a predetermined load out of said plurality of address predecode signal lines, each repeater circuit being connected between a corresponding address predecode signal line and the decoder, said decoder being directly connected to said predecoder by the remaining address predecode signal lines.

4. The semiconductor memory device according to claim 3, wherein each said repeater circuit includes an even number of stages of inverter circuits receiving a signal from a corresponding address predecode signal line.

5. The semiconductor memory device according to claim 3, wherein said decoder is a row decoder responsive to a row address predecode signal to select a row in said memory cell array.

6. The semiconductor memory device according to claim 3, wherein said decoder is a column decoder responsive to a column address predecode signal to select a column in said memory cell array.

7. A semiconductor memory device comprising:
 a memory cell array including a plurality of memory cells arranged in rows and columns;
 a spare memory cell array;
 a predecoder predecoding an address signal to generate an address predecode signal;
 a decoder responsive to said address predecode signal to select a row or column in said memory cell array;
 a plurality of address predecode signal lines connected between said predecoder and said decoder:

a plurality of repeater circuits corresponding to said plurality of address predecode signal lines, each repeater circuit being connected between a corresponding address predecode signal line and the decoder;

a spare decoder selecting a row or column in said spare memory cell array; and a program circuit programmable of a defective address, and directly receiving an address predecode signal from said predecoder to render said spare decoder active when said address predecode signal matches the programmed defective address.

8. The semiconductor memory device according to claim 7, wherein each said repeater circuit includes an even number of stages of inverter circuits receiving a signal from a corresponding address predecode signal line.

9. The semiconductor memory device according to claim 8, wherein said decoder is a row decoder responsive to a row address predecode signal to select a row in said memory cell array.

10. The semiconductor memory device according to claim 8, wherein said decoder is a column decoder responsive to a column address predecode signal to select a column in said memory cell array.

11. A semiconductor memory device comprising:

a decoder generating an address predecode signal of a plurality of bits in response to an address signal;

a plurality of address predecode signal lines corresponding to the plurality of bits of said address predecode signal, each address predecode signal line transmitting a signal of a corresponding bit of said address predecode signal;

a first program circuit corresponding to a first redundancy circuit, being programmable of a defective address, rendering said first redundancy circuit active when an input address predecode signal matches the programmed defective address, and including a plurality of first transistors corresponding to said plurality of address predecode signal lines, a first determination node from which a signal is generated to determine whether to render said first redundancy circuit active or not, and a plurality of first fuses corresponding to said plurality of first transistors, each first fuse being connected between said first determination node and a corresponding first transistor;

a second program circuit corresponding to a second redundancy circuit, being programmable of a defective address, rendering said second redundancy circuit active when an input address predecode signal matches the programmed defective address, and including a plurality of second transistors corresponding to said plurality of address predecode signal lines, each second transistor being located adjacent to a respective transistor of said plurality of first transistors;

a second determination node from which a signal is generated to determine whether to render said second redundancy circuit active or not, and a plurality of second fuses corresponding to said plurality of second transistors, each second fuse being connected between said second determination node and a corresponding second transistor; and a plurality of supply lines corresponding to said plurality of address predecode signal lines, each supply line common to said first and second transistors located adjacent to each other, and connected between a corresponding address predecode signal line and gates of said first and second transistors located adjacent to each other.

* * * * *